US011404593B2

(12) United States Patent
Takahashi et al.

(10) Patent No.: US 11,404,593 B2
(45) Date of Patent: Aug. 2, 2022

(54) DOUBLE-SIDED ELECTRODE TYPE SOLAR CELL AND SOLAR CELL MODULE

(71) Applicant: KANEKA CORPORATION, Osaka (JP)

(72) Inventors: Yuji Takahashi, Settsu (JP); Kunta Yoshikawa, Settsu (JP); Shinya Omoto, Settsu (JP)

(73) Assignee: KANEKA CORPORATION, Osaka (JP)

( * ) Notice: Subject to any disclaimer, the term of this patent is extended or adjusted under 35 U.S.C. 154(b) by 260 days.

(21) Appl. No.: 16/805,016

(22) Filed: Feb. 28, 2020

(65) Prior Publication Data

US 2020/0203545 A1 Jun. 25, 2020

Related U.S. Application Data

(63) Continuation of application No. PCT/JP2018/034222, filed on Sep. 14, 2018.

(30) Foreign Application Priority Data

Oct. 30, 2017 (JP) .............................. JP2017-209637

(51) Int. Cl.
  *H01L 31/042* (2014.01)
  *H02N 6/00* (2006.01)
  *H01L 31/05* (2014.01)
  *H01L 31/0224* (2006.01)
  *H01L 31/0747* (2012.01)

(52) U.S. Cl.
  CPC .. *H01L 31/0508* (2013.01); *H01L 31/022475* (2013.01); *H01L 31/0747* (2013.01)

(58) Field of Classification Search
  CPC .................................................. H01L 31/0508
  See application file for complete search history.

(56) References Cited

U.S. PATENT DOCUMENTS

2005/0150543 A1  7/2005  Nakashima et al.
2015/0364616 A1  12/2015 Tohoda
(Continued)

FOREIGN PATENT DOCUMENTS

JP  H11-186577 A   7/1999
JP  2004-228281 A  8/2004
JP  2005-229089 A  8/2005
(Continued)

OTHER PUBLICATIONS

English machine translation of JP 2015-198142 A (Year: 2022).*
(Continued)

*Primary Examiner* — Angelo Trivisonno
(74) *Attorney, Agent, or Firm* — Hauptman Ham, LLP

(57) ABSTRACT

A solar cell module which exhibits high output while ensuring connection strength between solar cells; and a solar cell suitable for the solar cell module. In the solar cell, a region on a first surface and at a first edge of a substrate that is not covered by a p-type transparent oxide electrode layer is defined as a "region A," and a region on the first surface and at a second edge opposite to the first edge of the substrate and not covered by the p-type transparent oxide electrode layer is defined as a "region B." The area of the region A is larger than the area of the region B.

10 Claims, 9 Drawing Sheets

(56) References Cited

U.S. PATENT DOCUMENTS

2017/0125619 A1* 5/2017 Nakano .......... H01L 31/022433
2017/0256661 A1   9/2017 Xu

FOREIGN PATENT DOCUMENTS

| JP | 2014-199875 A | 10/2014 |
| JP | 2015-198142 A | 11/2015 |
| JP | 2015198142 A * | 11/2015 |
| WO | 2014/132312 A1 | 9/2014 |
| WO | 2015/152020 A1 | 10/2015 |

OTHER PUBLICATIONS

International Search Report issued for corresponding International Application No. PCT/JP2018/034222 dated Dec. 4, 2018.
Written Opinion issued for corresponding International Application No. PCT/JP2018/034222 dated Dec. 4, 2018.

* cited by examiner

DOUBLE-SIDED ELECTRODE TYPE SOLAR CELL AND SOLAR CELL MODULE

PRIORITY CLAIM AND CROSS-REFERENCE

The instant application is a continuation of International Application No. PCT/JP2018/034222 filed on Sep. 14, 2018 which claims the benefit of priority to Japanese Patent Application No. 2017-209637 filed Oct. 30, 2017 in the JPO (Japanese Patent Office). Both of the priority documents are hereby incorporated by reference in their entireties.

BACKGROUND

Double-sided electrode type solar cells are sometimes modularized by overlapping parts of the solar cell with each other without using a conductive connection line. By using this manner of modulation, the solar cells are directly, electrically, and physically connected. (See, for example, Japanese Unexamined Patent Application, Publication No. H11-186577).

Such a connection method is referred to as a singling method. According to this method, mounting substantially more solar cells in the limited solar cell mounting area of a solar cell module becomes possible. As a result, the light receiving area for photoelectric conversion increases. Therefore, this connection method is considered to improve the output of the solar cell module.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
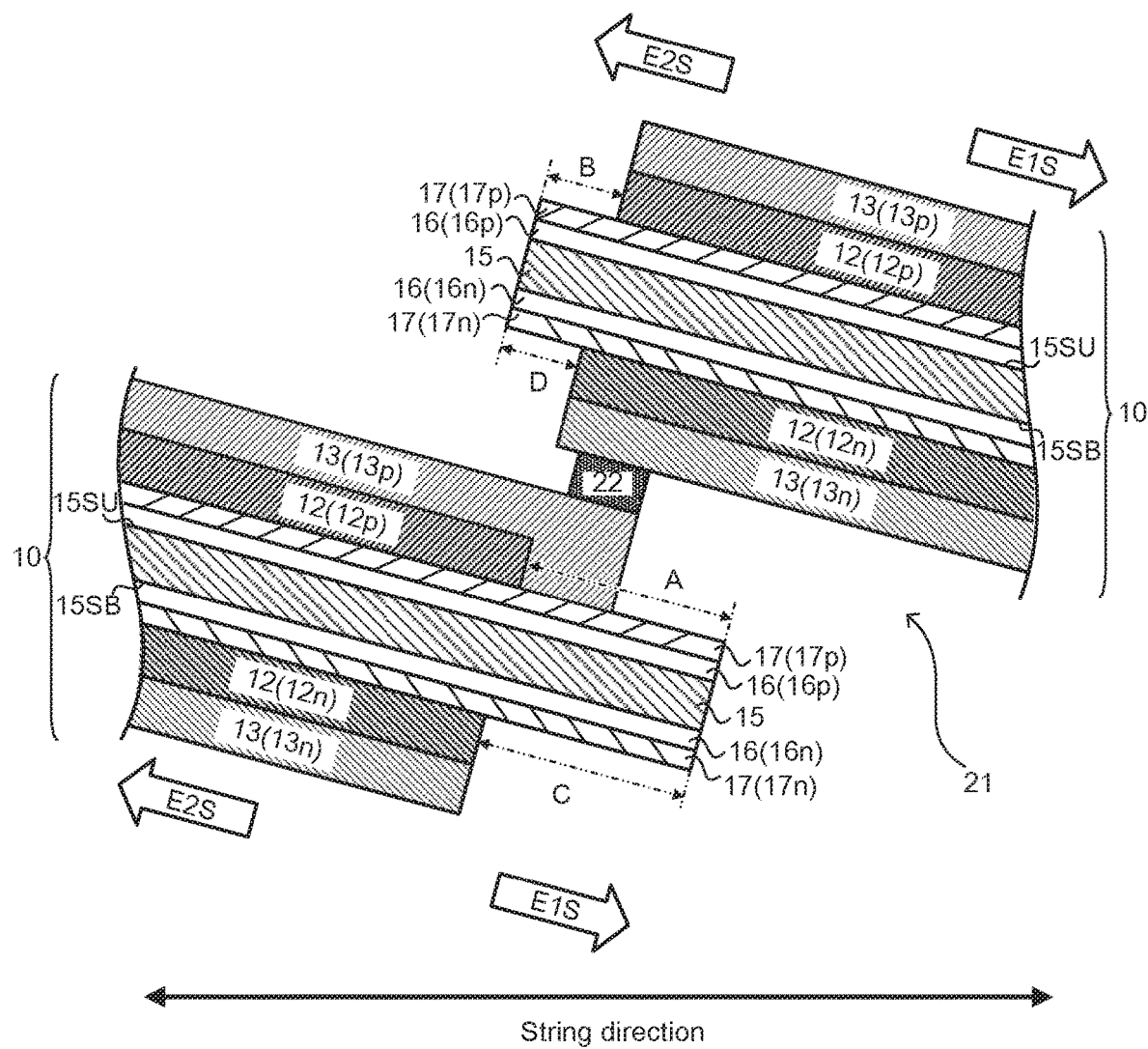
FIG. 1 is a sectional view of a solar cell module according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, signaling method of solar cell modulation increases the light receiving area for photoelectric conversion.

However, simply increasing the light receiving area in the solar cell module does not necessarily improves the output. The output depends not only on the light receiving area but also various additional factors.

A dark current generated between the pn junctions of the solar cell is one of such additional factors. When the dark current is generated, an operating point voltage of the solar cell decreases and thus, the output decreases. Indeed, when the singling method is used, since a portion of a solar cell is light-shielded by a portion of the adjacent solar cell, dark current is often generated.

To suppress such a dark current, narrowing the area in which the portion of the solar cells overlap each other is often sufficient. However, doing so would narrow the physical connection area and result in insufficient connection strength between the solar cells.

In addition, in order to electrically and physically connect the solar cells, a conductive adhesive agent is sometimes interposed between the portions of the solar cells that overlap each other. The conductive adhesive agent spreads during thermal compression bonding to a light receiving surface of the solar cell. The spread conductive adhesive sometimes causes shadow loss.

Therefore, in some embodiments, the instant specification is directed to a solar cell module that both exhibits high output and has strong connections between solar cells.

In some embodiments, the instant specification is directed to a solar cell suitable for the above solar cell module.

Double-Sided Electrode Type Solar Cell

In some embodiments, the instant specification is directed to a double-sided electrode type solar cell.

In some embodiments, the double-sided electrode type solar cell includes: a semiconductor substrate; a p-type semiconductor layer on a first major surface of the semiconductor substrate; an electrode layer for p-type on the first major surface of the semiconductor substrate and the p-type semiconductor layer; an n-type semiconductor layer on a second major surface of the of the semiconductor substrate; and an electrode layer for n-type on the second surface of the semiconductor substrate and the n-type semiconductor layer.

Referring to FIG. 1, in some embodiments, the first major surface of the semiconductor substrate is a light receiving surface 15SU and the second major surface of the semiconductor substrate is a backside surface 15SB. According to these embodiments, the p-type semiconductor layer (16*p*+

17p) and the electrode layer for p-type (12p+13p) are on the light receiving surface 15SU, and the n-type semiconductor layer (16n+17n) and the electrode layer for n-type (12n+13n) is on the backside surface 15SB.

Figure 2:
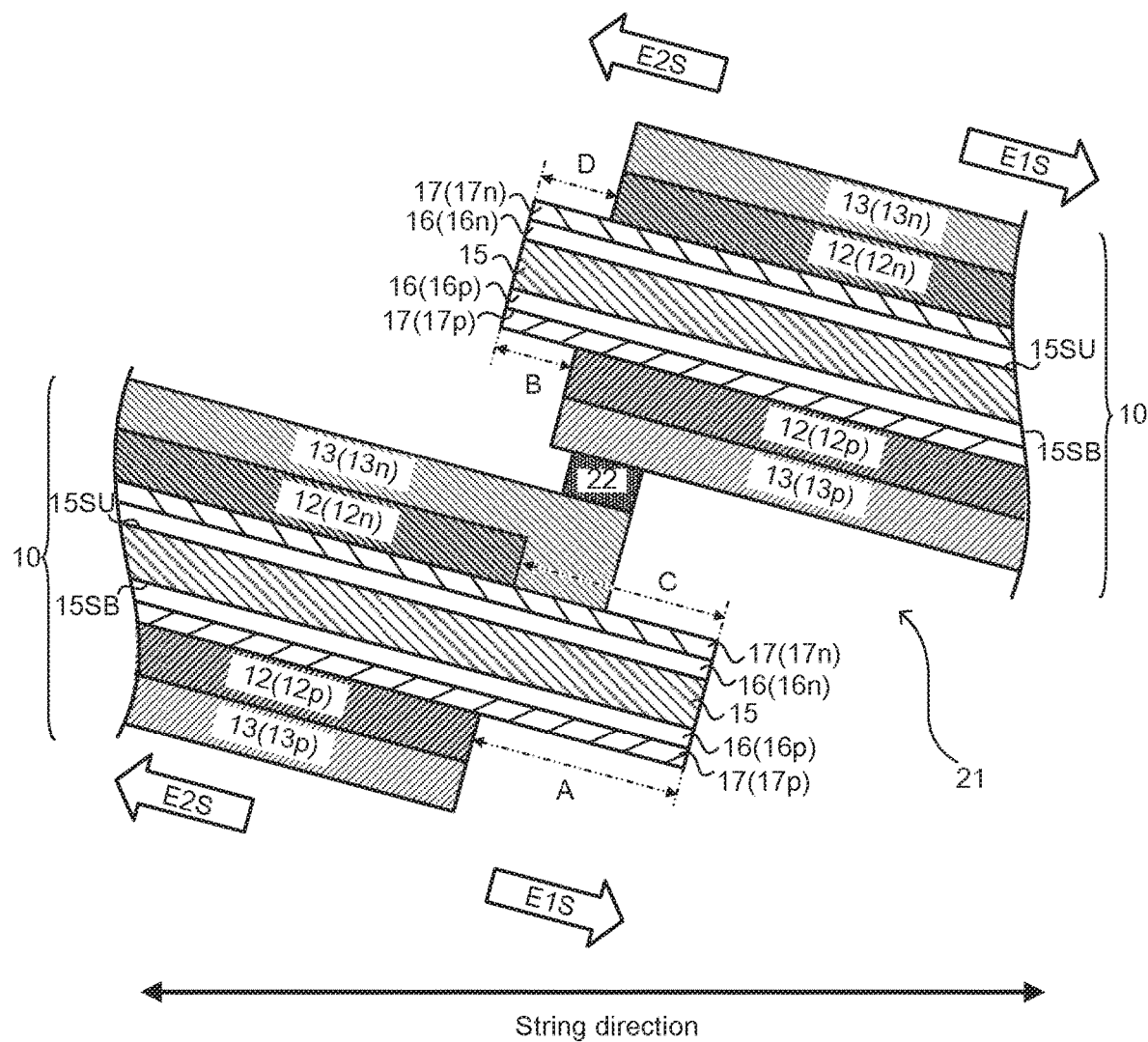
FIG. 2 is a sectional view of a solar cell module according to some embodiments.

Referring to FIG. 2, in some embodiments, the first major surface of the semiconductor substrate is the backside surface 15SB and the second major surface of the semiconductor substrate is the light receiving surface 15SU. According to these embodiments, the p-type semiconductor layer (16p+17p) and the electrode layer for p-type (12p+13p) are on the backside surface 15SB, and the n-type semiconductor layer (16n+17n) and the electrode layer for n-type (12n+13n) is on the light receiving surface 15SU.

The instant specification will mainly describe the double-sided electrode type solar cell in which the p-type semiconductor layer and the electrode layer for p-type are on the light receiving surface 15SU, and the n-type semiconductor layer and the electrode layer for n-type is on the backside surface 15SB (see e.g. FIGS. 1 and 3-10).

Figure 4:
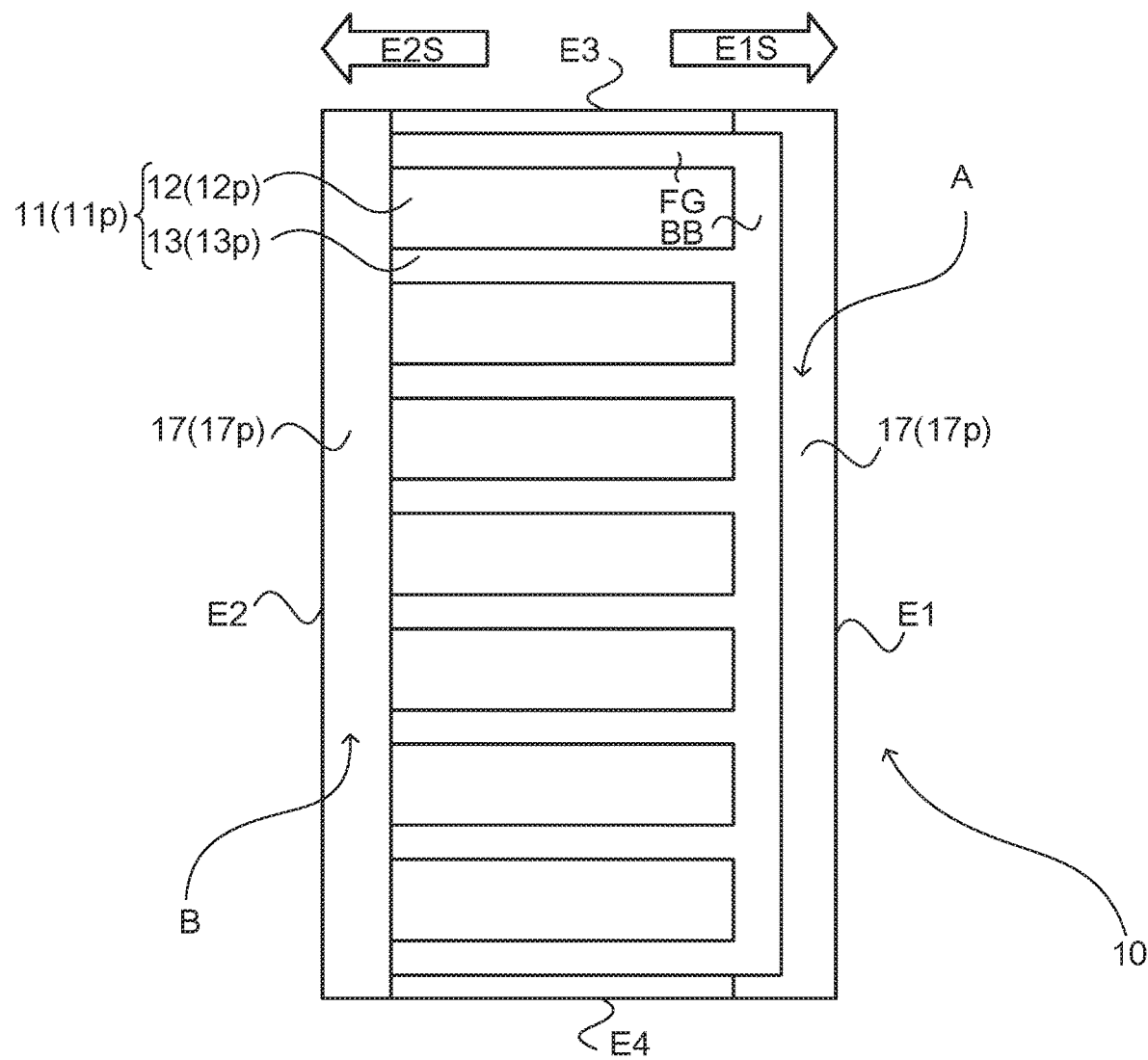
FIG. 4 is a plan view of the solar cell of FIG. 3.

Refer to FIG. 4, in some embodiments, a planar shape of the semiconductor substrate 15 is an approximately rectangular shape including four edges: E1 to E4. In some embodiments the planar shape is an approximately oblong shape in which edges E1 and E2 are longer sides E3 and E4. According to these embodiments, the "approximately rectangular shape" includes not only rectangular shapes in which all four corners are 90 degrees, but also shapes in which one or more corners are missing, such as rounded. Similarly, the "approximately oblong shape" includes not only a complete oblong shape but also a shape in which at least one corner is missing, such as a shape in which at least one corner is rounded.

In some embodiments, the semiconductor substrate 15 is a silicon substrate. In some embodiments, the semiconductor substrate 15 is a substrate formed of monocrystalline silicon, such as a silicon wafer, or a substrate formed of polycrystalline silicon. Hereinafter, a monocrystalline silicon substrate will be described as an example.

In some embodiments, the semiconductor substrate 15 is an n-type monocrystalline silicon substrate containing impurities that introduce an electron into a silicon atom. In some embodiments, the impurities for the n-type monocrystalline silicon substrate is a phosphorus atom. In some embodiments, the substrate 15 is a p-type monocrystalline silicon substrate containing impurities that introduce a hole into a silicon atom. In some embodiments, the impurities for the p-type monocrystalline silicon substrate a boron atom. Because n-type semiconductor substrate sometimes have a long carrier lifetime, an n-type semiconductor substrate 15 will be described as an example.

In some embodiments, the semiconductor substrate 15 has protrusions or depressions formed at least on the light receiving surface 15SU, and therefore has an uneven texture structure. When the semiconductor substrate 15 has the uneven texture structure on the light receiving surface 15SU, light received on the light receiving surface 15SU are better trapped by the solar cell. In some embodiments, the uneven texture structure is formed by anisotropic etching to which a difference between an etching rate of a (100) surface and an etching rate of a (111) surface is applied.

In some embodiments, a thickness of the semiconductor substrate 15 is less than or equal to 200 µm, because using a semiconductor substrate 15 having a thickness exceeding 200 µm results in the use of excessive amount of silicon.

In some embodiments, the thickness of the semiconductor substrate 15 is greater than or equal to 50 µm. In some embodiments, the thickness of the semiconductor substrate 15 is greater than or equal to 70 µm. When the thickness of the semiconductor substrate 15 is less than 50 µm, mechanical strength of the solar cell 10 decreases. In addition, the external light, such as sunlight, is not sufficiently absorbed by the solar cell having such small thickness, and a short-circuit current density of the solar cell decreases.

As described above, the semiconductor substrate 15 sometimes has an uneven texture structure. Therefore, in the case where the semiconductor substrate 15 sometimes has an uneven texture structure, the thickness is measured in a direction perpendicular to an average surface of the semiconductor substrate 15, which is not depend on the texture structure. Furthermore, the thickness of the semiconductor substrate 15 is defined as a maximum distance between straight lines connecting vertexes of protrusions in a depression-protrusion structure on each of the light receiving side and the backside.

In some embodiments, the semiconductor substrate 15 is made from a silicon wafer. In some embodiments, the semiconductor substrate 15 is made by cutting the silicon wafer to 5-inch squares or 6-inch squares. According to these embodiments, solar cells 10 having a size smaller than that of the silicon wafer is obtained, which includes a thin and flexible semiconductor substrate 15 which is unlikely to be damaged.

Referring to FIGS. 1, 3, 7 and 9, in some embodiments, the semiconductor layer (16+17) includes an intrinsic semiconductor layer 16. In some embodiments, the intrinsic semiconductor layer 16 includes a p-type intrinsic semiconductor layer 16p and an n-type intrinsic semiconductor layer 16n.

In some embodiments, both of the intrinsic semiconductor layers 16 (16p and 16n) directly cover the first and the second major surfaces of the semiconductor substrate layer. In other words, the intrinsic semiconductor layers 16 covers both the light receiving surface 15SU and the backside 15SB of the semiconductor substrate 15. According to these embodiments, the intrinsic semiconductor layers 16 perform surface passivation while suppressing impurity diffusion to the semiconductor substrate 15. As used herein, the term "intrinsic (or i type) semiconductor layer" is not limited to completely intrinsic layers that has no conductive impurities. Rather, the term "intrinsic semiconductor layer" also includes "weak n-type" or "weak p-type" substantially intrinsic layers which include a slight amount of n-type impurities or p-type impurities in a range that allows the semiconductor layers to function as or similar to an intrinsic layer.

Refer to FIGS. 1, 3 7 and 9, in some embodiments, the shape and the area of the p-type intrinsic semiconductor layer 16p are approximately identical to those of the first major surface of the semiconductor substrate 15, and the shape and the area of the n-type intrinsic semiconductor layer 16n are approximately identical to those of the second major surface of the semiconductor substrate 15. However, the instant specification is not limited thereto.

The material of the intrinsic semiconductor layers 16 is not particularly limited. In some embodiments, the intrinsic semiconductor layer 16 includes an amorphous silicon-based thin film, such as a hydrogenated amorphous silicon-based thin film layer that includes silicon and hydrogen.

The method of forming the intrinsic semiconductor layers 16 is not particularly limited. In some embodiments, the intrinsic semiconductor layers 16 are formed by a plasma chemical vapor deposition (CVD) method. When the layers are formed by a CVD method on a semiconductor substrate 15 made from a monocrystalline silicon, the passivation of the surface of the substrate is effectively performed while suppressing the diffusion of the impurities to the monocrystalline silicon. In addition, in the plasma CVD method, the hydrogen concentration in the intrinsic semiconductor layer 16 changes in a thickness direction, and an effective energy gap profile is also formed in collecting carriers. Therefore, depending on the materials used for semiconductor substrate 15, CVD method is sometimes preferable when forming the intrinsic semiconductor layer 16.

In some embodiments, the CVD method is a plasma CVD method. In some embodiments, the plasma CVD is performed with a substrate temperature higher than or equal to 100° C. and lower than or equal to 300° C., a pressure greater than or equal to 20 Pa and less than or equal to 2600 Pa, and a high-frequency power density greater than or equal to 0.003 W/cm$^2$ and less than or equal to 0.5 W/cm$^2$.

In some embodiments, the intrinsic semiconductor layers 16 are hydrogenated amorphous silicon-based thin film. According to these embodiments, a silicon-containing gas such as SiH$_4$ and Si$_2$H$_6$, or a mixtures thereof, as well as H$_2$ are used as raw material gas for forming the thin film.

Referring to FIGS. 1, 3, 7 and 9, in some embodiments, the semiconductor layers 16 further include conductivity type semiconductor layers 17. In some embodiments, the conductivity type semiconductor layers 17 includes a p-type conductivity type semiconductor layer 17p and an n-type semiconductor layer further includes a second conductivity type semiconductor layers 17n.

Referring to the exemplary solar cells 10 as shown in FIGS. 1, 3, 7 and 9, the p-type conductivity type semiconductor layer 17p is formed on the p-type intrinsic semiconductor layer 16p, which is in turn formed on the first major surface (the light receiving surface 15SU in this case) of the semiconductor substrate 15. The n-type conductivity type semiconductor layer 17n is formed on the n-type intrinsic semiconductor layer 16n, which is in turn formed on the second major surface (the backside surface 15SB in this case) of the semiconductor substrate 15 on the backside.

Refer to FIGS. 1, 3, 7 and 9, in some embodiments, the shape and the area of the p-type conductivity type semiconductor layer 17p are approximately identical to those of the p-type intrinsic semiconductor layer 16p and the first major surface of the semiconductor substrate 15. The shape and the area of the n-type conductivity type semiconductor layer 17n are approximately identical to those of the n-type intrinsic semiconductor layer 16n, and the second major surface of the semiconductor substrate 15. However, the instant specification is not limited thereto. The manufacturing method of the conductivity type semiconductor layers 17 is not particularly limited. In some embodiment, the conductivity type semiconductor layers 17 are formed in manner similar to those for the intrinsic semiconductor layers 16, such as by a plasma CVD method.

In some embodiments, the p-type conductivity type semiconductor layer 17p includes a silicon layer. In some embodiments, the p-type conductivity type semiconductor layer is a silicone layer including a p-type dopant. In some embodiments, the p-type dopant is boron or a similar p-type dopant. In some embodiments, the p-type conductivity type semiconductor layer 17p includes a p-type hydrogenated amorphous silicon layer, a p-type amorphous silicon carbide layer, or a p-type amorphous silicon oxide layer. In some embodiments, the p-type conductivity type semiconductor layer 17p is formed of amorphous silicon. When the p-type conductivity type semiconductor layer 17p is formed of amorphous silicon, the impurity diffusion is suppressed and the series resistance is decreased. In some embodiments, the p-type amorphous silicon carbide layer and the p-type amorphous silicon oxide layer are a low-refractive index layer with a wide gap, which reduces optical loss.

In some embodiments, the n-type conductivity type semiconductor layer 17n includes a silicon layer. In some embodiments, the n-type conductivity type semiconductor layer 17n is a silicon layer including an n-type dopant. In some embodiments, the n-type dopant includes phosphorus or a similar dopant. In some embodiments, the conductivity type semiconductor layer 17n is formed of an amorphous silicon layer. The advantages of using amorphous silicon in layer 17n is similar to those as detailed above for layer 17p.

Referring to FIGS. 1, 3, 7 and 9, in some embodiments, the electrode layers 11 (11p and 11n) individually cover the p-type conductivity type semiconductor layer 17p and the n-type conductivity type semiconductor layer 17n and are thus electrically connected to the semiconductor layers 17p and 17n. In some embodiments, the electrode layers 11 function as a transport layer that guides a carrier generated in the p-type semiconductor layer 17p or the n-type semiconductor layer 17n.

As described above, in a case where the conductivity type semiconductor layers 17 are individually formed on one surface side and the other surface side of the major surfaces 15SU and 15SB of the semiconductor substrate 15, the electrode layers 11 are also individually formed on one surface side and the other surface side of the semiconductor substrate 15. For this reason, the solar cell 10 is referred to as a double-sided electrode type solar cell 10 in the instant specification.

In some embodiments, the electrode layers 11 are of a multilayer structure.

Referring to FIGS. 1, 3, 7 and 9, in some embodiments, the electrode layer for p-type 11p includes a transparent oxide electrode layer for p-type 12p, and the electrode layer for n-type 11n includes a transparent oxide electrode layer for n-type 12n.

In some embodiments, transparent oxide electrode layers 12 (12p and 12n) include a transparent conductive oxide as a main component, and are individually in direct contact with the first conductivity type semiconductor layer 17p and the second conductive semiconductor layer 17n. As used herein, the term "main component" indicates that the content of the substance is greater than or equal to 51 weight %, such as greater than or equal to 70 weight %, such as 90 weight %. In some embodiments, the transparent oxide electrode layers 12 include a substance in addition the transparent conductive oxide, as long as the additional substances do not interfere with the function of the transparent oxide electrode layers 12. In some embodiments, the transparent oxide electrode layers 12 have a single layer structure or a multilayer structure.

The transparent conductive oxide is not particularly limited. In some embodiments, the transparent conductive oxide includes zinc oxide, indium oxide, or a material in which various metal oxides (for example, titanium oxide, tin oxide, tungsten oxide, molybdenum oxide, and the like) are added to indium oxide in an amount of greater than or equal to 1 weight % and less than or equal to 10 weight %. In some embodiments, a doping agent such as Sn, W, As, Zn, Ge, Ca, Si, C, or combinations thereof is added to the transparent conductive oxide.

In some embodiments, a thickness of the transparent oxide electrode layers 12 is greater than or equal to 10 nm and less than or equal to 140 nm. In some embodiments, the transparent oxide electrode layers 12 having the above film thickness are formed by a physical vapor deposition (PVD)

method such as a sputtering method, a chemical vapor deposition (MOCVD) method using a reaction between an organic metal compound and oxygen or water, or the like.

Referring to FIGS. 3, 4 and 7-10, in some embodiments, a shape of the transparent oxide electrode layer for p-type 12p is an approximately rectangular shape that is identical to the shape of the p-type conductivity type semiconductor layer 17p. The area of the transparent oxide electrode layer for p-type 12p is, however, smaller than the area of the p-type conductivity type semiconductor layer 17p. According to these embodiments, the first transparent oxide electrode layer 12p is formed such that a region that is not covered by the transparent oxide electrode layer 12p is formed on one end side E1S and the other end side E2S, one end side E1S being one of the facing sides E1 and E2 of the semiconductor substrate 15, the other end side E2S being the other of the facing sides.

Referring to FIGS. 3, 4 and 7-10, in some embodiments, a shape of the transparent oxide electrode layer for n-type 12n is the approximately rectangular shape that is identical to the shape of the n-type conductivity type semiconductor layer 17n. The area of the transparent oxide electrode layer for n-type 12n is, however, smaller than the area of the n-type conductivity type semiconductor layer 17n. According to these embodiments, the transparent oxide electrode layer for n-type 12n is formed such that a region that is not covered with the transparent oxide electrode layer 12n is formed on one end side E1S and the other end side E2S of the semiconductor substrate 15.

In some embodiments, the transparent oxide electrode layers 12 are formed by using a lift-off method that is a partial coating method of a film mask. According to these embodiments, a film mask having a patterned opening is used, and the transparent oxide electrode layers 12 are formed in a portion overlapping the opening, and the transparent oxide electrode layers are formed immediately below a non-opening portion, a conductive region in which the transparent oxide electrode layers 12 are formed and a region (a non-conductive region) in which the transparent oxide electrode layer is not formed are formed.

Note that, the film formation of the transparent oxide electrode layers 12 is not limited to the lift-off method. In some embodiments, the transparent oxide electrode layers 12 are formed by a method of directly preparing a pattern by forming a film through a perforated metal such as a stencil mask, a method of forming the transparent oxide electrode layers are on the entire conductivity type semiconductor layers 17, and then of removing the transparent oxide electrode layers 12 by partial etching (a subtractive method), or a method of directly applying a transparent electrode material only to a conductive region, and of forming a conductive layer (an additive method).

In some embodiments, the electrode layers 11 include, in addition to the transparent oxide electrode layers 12, metal electrode layers 13. In some embodiments, the metal electrode layers 13 include a metal electrode layer for p-type 13p formed on the transparent oxide electrode layer for p-type 12p and facing the first major surface of the semiconductor substrate 15, and a metal electrode layer for n-type 13n formed on the transparent oxide electrode layer for n-type 12n and facing the second major surface of the semiconductor substrate 15.

In some embodiments, the metal electrode layers 13 are formed by directly stacking at least a part thereof on the surface side of the transparent oxide electrode layers 12. According to these embodiments, the metal electrode layers 13 are electrically connected to the transparent oxide electrode layers 12. In some embodiments, another layer is interposed between the layers 12 and 13 insofar as the metal electrode layers 13 are electrically connected to the transparent oxide electrode layers 12.

The material of the metal electrode layers 13 is not particularly limited. In some embodiments, the material include silver, copper, aluminum, nickel, or the like. In some embodiments, the material of the metal electrode layers 13 includes a conductive paste containing a metal material and a binder resin.

Referring to FIGS. 3-10, since the metal electrode layers 13 include a light shielding material, in some embodiments, the metal electrode layer (the metal electrode layer for p-type 13p in the case of FIGS. 3-10) on the light receiving surface 15SU is formed into the shape of a thinned pattern so as to allow light to reach the layers under this layer. Referring to FIGS. 3, 4 and 7-10, the instant specification describes several examples of such thinned pattern.

Figure 3:
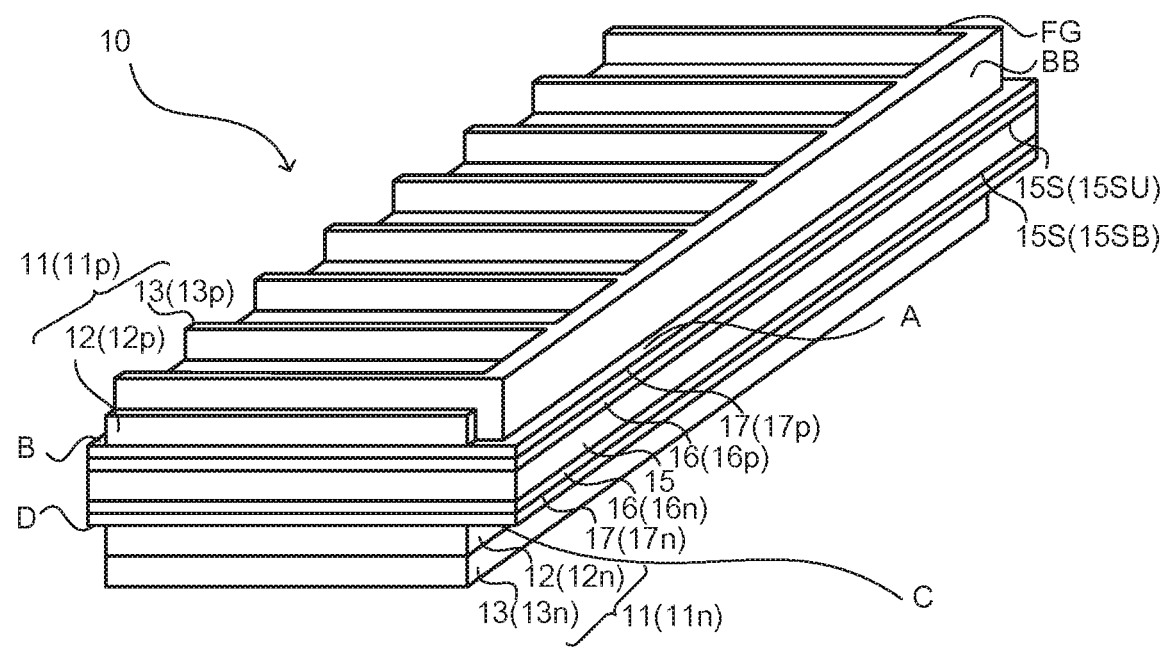
FIG. 3 is a perspective view of a solar cell module according to some embodiments.

Referring to FIGS. 3 and 4, one of such thinned pattern, a "comb" type first metal electrode layer 13p is exemplified.

In the exemplary embodiment of the comb type first metal electrode layer 13p, the "comb shaft" portion is referred to as a bus bar part BB, and the "comb teeth" along a length direction of the "comb shaft" portion that intersect with and orthogonal to the "comb shaft portion" are referred to as finger parts FG.

Referring to FIGS. 3 and 4, the bus bar part BB is formed along a side on one end side E1 (a long side direction) of the semiconductor substrate 15, and the finger parts FG extend along a short side direction (the short sides E3 and E4) intersecting with the long side direction and arranged along the long side direction, but the present invention is not limited thereto. In addition, referring to FIGS. 3 and 4, the bus bar part BB extends from terminals of a plurality of finger parts FG on the surface of the first transparent oxide electrode layer 12p, and reaches the first conductivity type semiconductor layer 17p, but the instant specification is not limited thereto.

Figure 7:
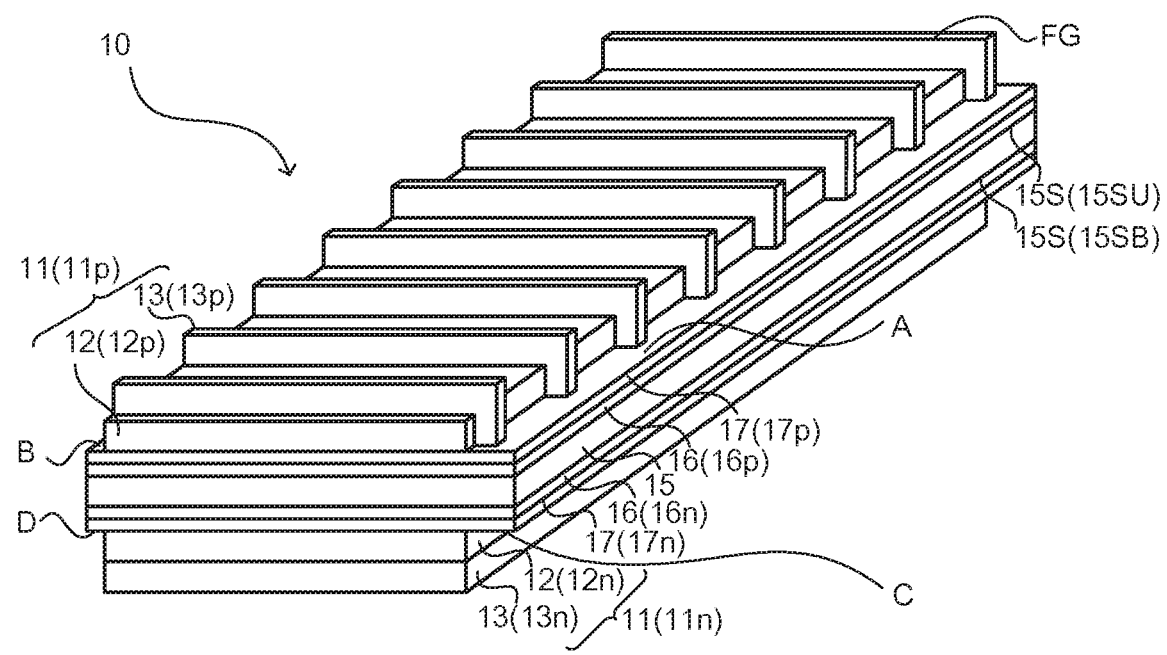
FIG. 7 is a perspective view of a solar cell according to some embodiments.
Figure 8:
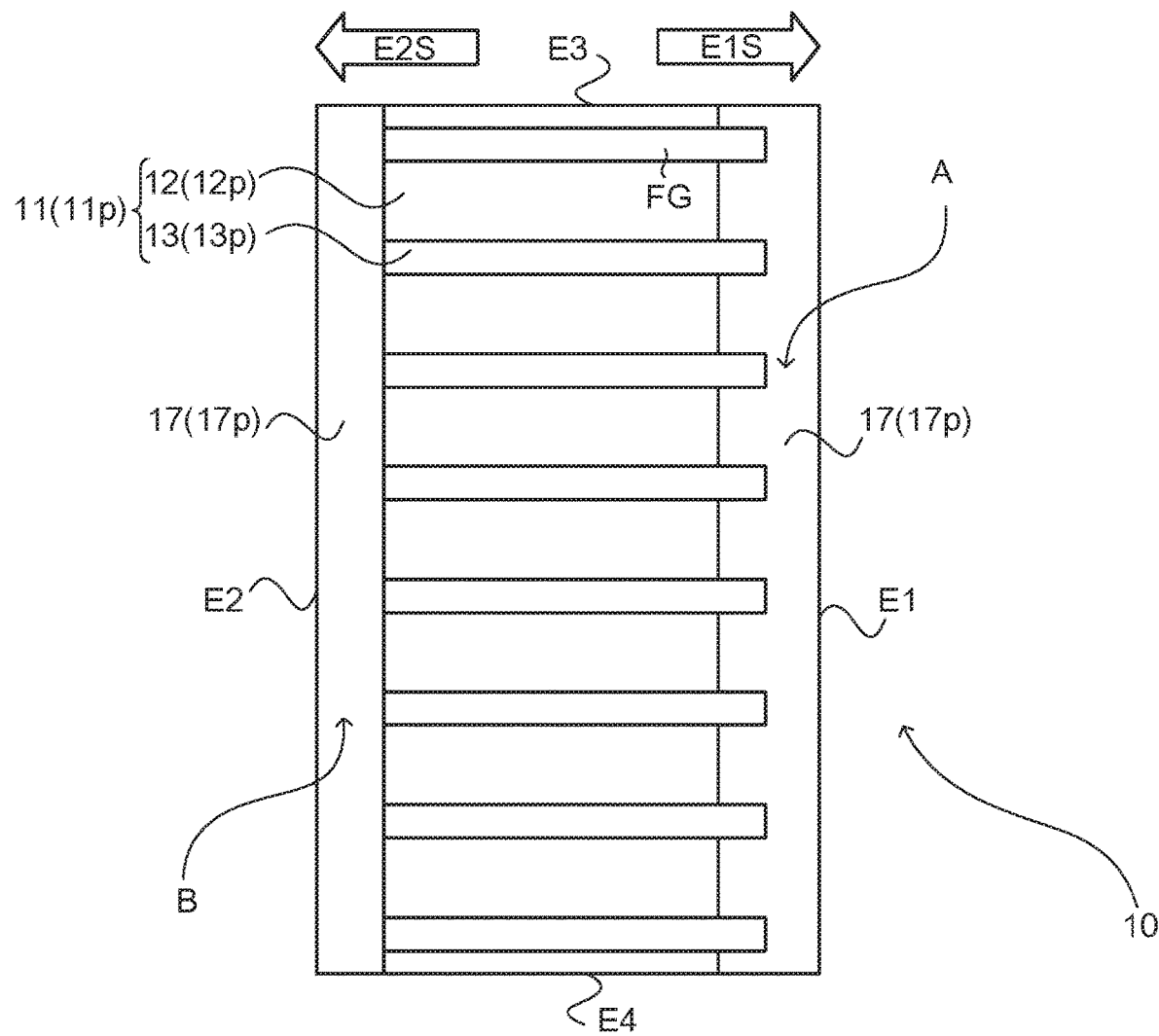
FIG. 8 is a plan view of the solar cell of FIG. 7.

Referring to FIGS. 7 and 8, in some embodiments, the metal electrode layer for p-type 13p includes only the finger part FG. As will be described in the "Solar Cell Module" section below, in some embodiments, the conductive adhesive agent 22 connecting adjacent solar modules is disposed in the position of the bus bar part BB illustrated in FIG. 3 to carry out the function of the bus bar part BB.

Figure 9:
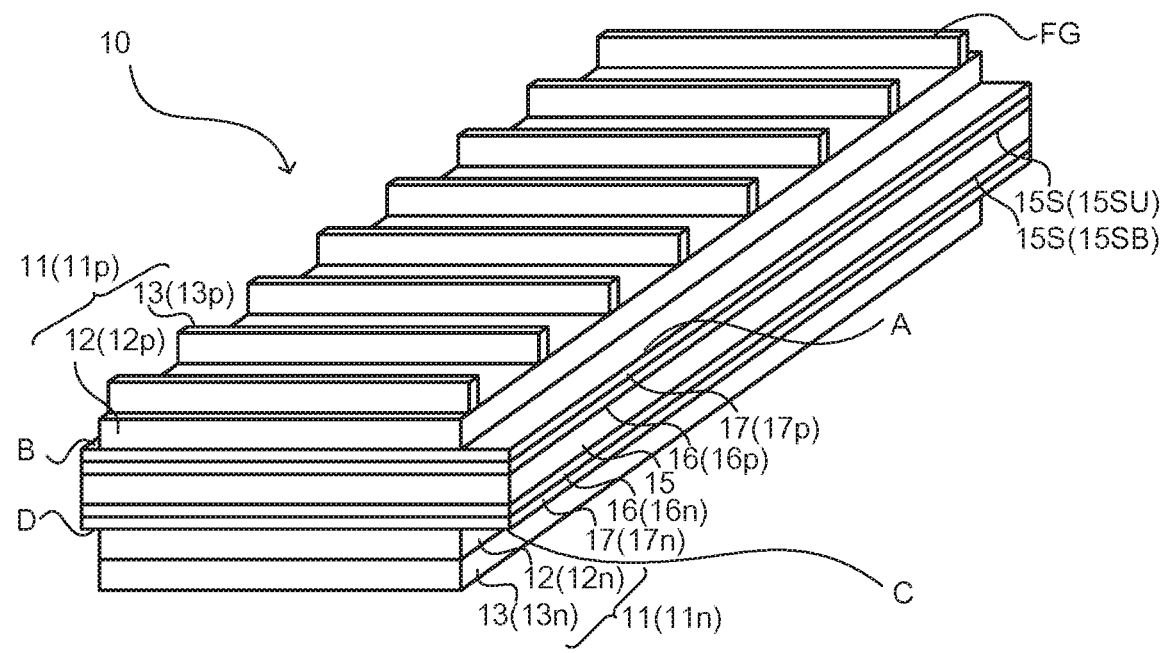
FIG. 9 is a perspective view of a solar cell according to some embodiments.
Figure 10:
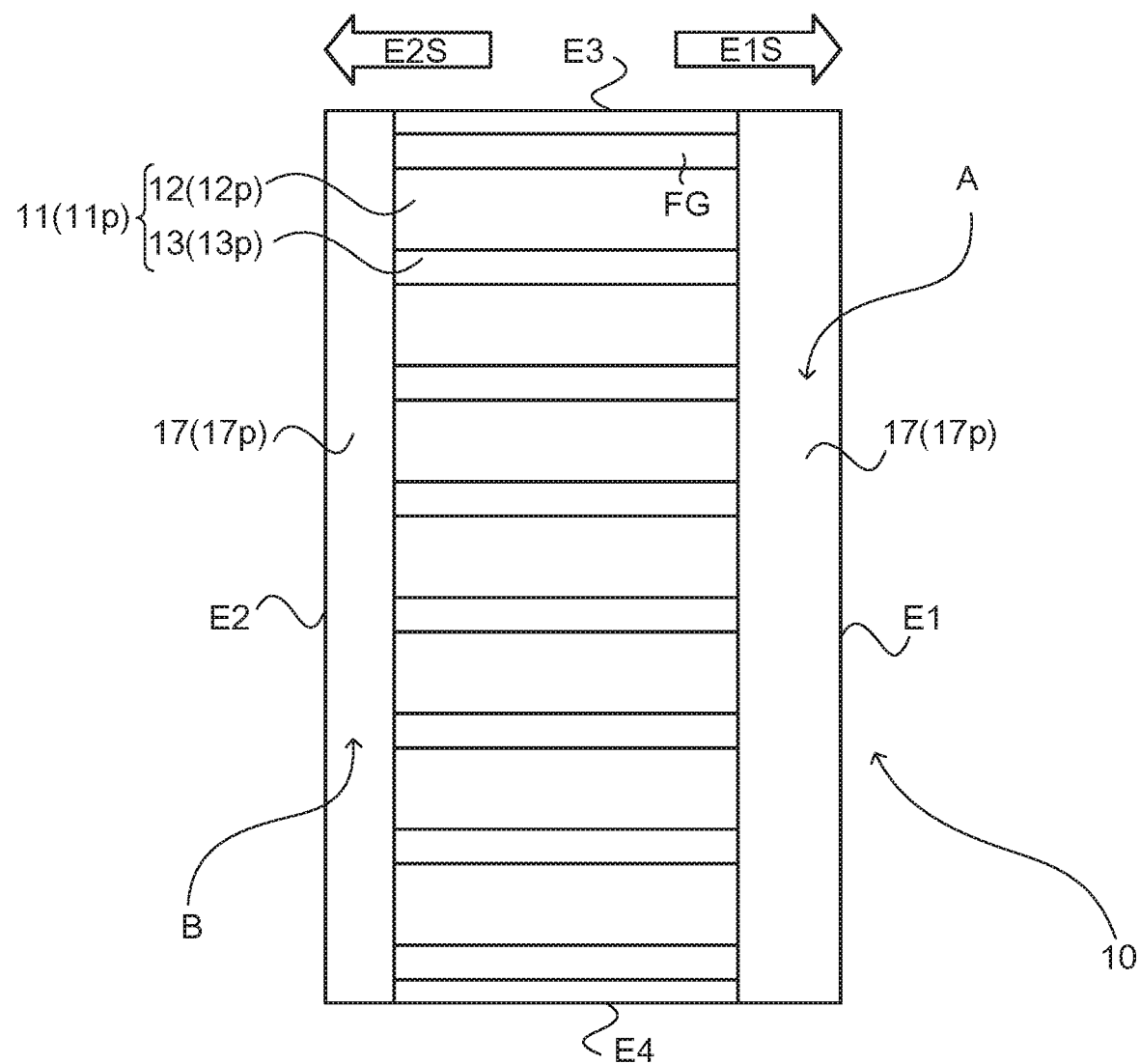
FIG. 10 is a plan view of the solar cell of FIG. 9.

Referring to FIGS. 9 and 10, in some embodiments, the finger part FG fall within the surface of the transparent oxide electrode layer for p-type 12p. According to these embodiments, the conductive adhesive agent 22 is disposed to connect the respective finger parts FG, and used instead of the bus bar part BB illustrated in FIG. 3. In some embodiments, the conductive adhesive agent 22 is disposed on the transparent oxide electrode layer for p-type 12p, and is disposed on the p-type conductivity type semiconductor layer 17p.

In some embodiments, the bus bar part BB or the conductive adhesive agent 22 are in the shape of a plurality of lines, or in a non-linear shape.

Referring to FIGS. 1, 3, 7 and 9, in some embodiments, the metal electrode layer for n-type 13n is on the backside of the solar cell 10 on which light is not directly incident and therefore does not shield the semiconductor substrate 15 from light. Accordingly, in some embodiments, the metal electrode layer for n-type 13n, as illustrated in FIGS. 3, 7 and 9, has a planar shape having approximately the same size as that of the transparent oxide electrode layer 12n, and is formed to fall within the area of the transparent oxide electrode layer for n-type 12n. However, the metal electrode layer is not limited to such a planar electrode in a rectangular shape. In some embodiments, the metal electrode layer for n-type 13n is a thinned pattern such as the comb type metal electrode layer the same as or similar to those described above for layer 13p.

In some embodiments, a thickness of the metal electrode layers 13 is greater than or equal to 20 μm and less than or equal to 80 μm. In some embodiments, the metal electrode layers 13 are formed by a printing method of performing ink jet printing or screen printing with respect to a conductive paste, or a plating method in order to achieve the thickness. However, the present invention is not limited thereto, but in the case of adopting a vacuum process, a vapor deposition method or a sputtering method may be adopted.

In some embodiments, the intrinsic semiconductor layers 16, the conductivity type semiconductor layers 17, and the electrode layers 11 are laminated on the semiconductor substrate 15, and undergo an annealing treatment in order for the passivation of each junction interface, and for the suppression of the occurrence of a defect level on the semiconductor layer and the interface thereof.

In some embodiments, the annealing treatment includes a heating treatment in which a semiconductor substrate 15 on which each layer is disposed is put into an oven that is heated at a temperature higher than or equal to 150° C. and lower than or equal to 200° C. In some embodiments, the atmosphere in the oven may be the atmospheric air, hydrogen or nitrogen. When hydrogen or nitrogen are used, the annealing treatment is more effectively performed. In some embodiments, the annealing treatment is a rapid thermal annealing (RTA) treatment in which the semiconductor substrate 15 on which each layer is disposed is irradiated with an infrared ray by an infrared heater.

Referring to FIGS. 1, 2, 3, 7 and 9, in some embodiments, the transparent oxide electrode layer for p-type 12p does not fully cover the p-type semiconductor layer (16p+17p). According to these embodiments, on the first surface and near a first edge E1S of the semiconductor substrate, a region of the semiconductor layer for p-type (16p+17p) that is not covered by the transparent oxide electrode layer for p-type 12p is defined as a "region A." On the first surface and near a second edge E2S of the semiconductor substrate 15 opposite to the first edge, a region of the semiconductor layer for p-type (16p+17p) that is not covered by the transparent oxide electrode layer for p-type 12p is defined as a "region B."

In some embodiments, an area of the region A is larger than an area of the region B.

In some embodiments, a length of the region B along a direction connecting the first edge and the second is less than 2 times a thickness of the semiconductor substrate.

Referring to FIGS. 1, 2, 3, 7 and 9, in some embodiments, the transparent oxide electrode layer for n-type 12n does not fully cover the n-type semiconductor layer (16n+17n). On the second surface and near a first edge E1S of the semiconductor substrate, a region of the n-type semiconductor layer (16n+17n) that is not covered by the transparent oxide electrode layer for n-type 12n is defined as a "region C." On the second surface and near a second edge E2S of the semiconductor substrate, a region of the n-type semiconductor layer (16n+17n) that is not covered by the transparent oxide electrode layer for n-type 12n is defined as a "region D."

In some embodiments, an area of the region D is smaller than or equal to the area of the region B.

In some embodiments, an area of the region C is larger than the area of the region B.

Referring to FIG. 1, in some embodiments, the first major surface of the semiconductor substrate 15 is the light receiving surface 15SU. Accordingly, in some embodiments, at least a portion of the region A is covered by the metal electrode layer for p-type 13p. In some embodiments, an area of the metal electrode layer for n-type 13n that is electrically connected to and covers the transparent oxide electrode layer for n-type 12n is smaller than or equal to an area of the transparent oxide electrode layer for n-type 12n, and does not overlap with the region C.

Referring to FIG. 2, in some embodiments, the second major surface of the semiconductor substrate 15 is the light receiving surface 15SU. Accordingly, in some embodiments, at least a portion of the region C is covered by the metal electrode layer for n-type 13n. In some embodiments, an area of the metal electrode layer for p-type 13p that is electrically connected to and covers the transparent oxide electrode layer for p-type 12p is smaller than or equal to an area of the transparent oxide electrode layer for p-type 12p, and does not overlap the region A.

The desirable effects of the above described relative sizes of regions A, B, C and D and the layers will become apparent in the "Solar Cell Module" section below.

Solar Cell Module

In some embodiments, the instant specification is directed to a solar cell module.

In some embodiments, the solar cell module include the double-sided electrode type solar cell similar to those as detailed above.

Figure 5:
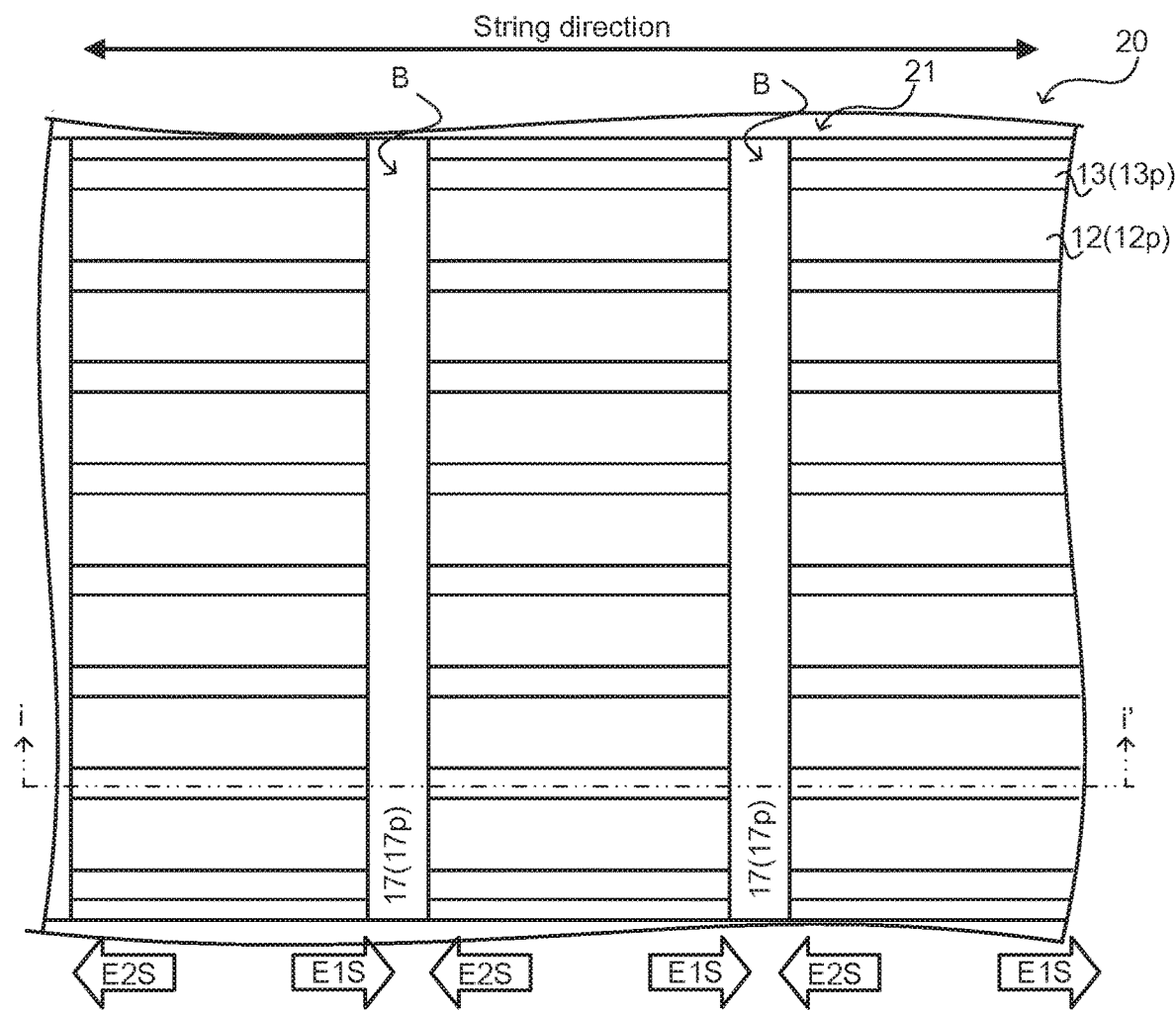
FIG. 5 is a plan view of a solar cell module according to some embodiments.
Figure 6:
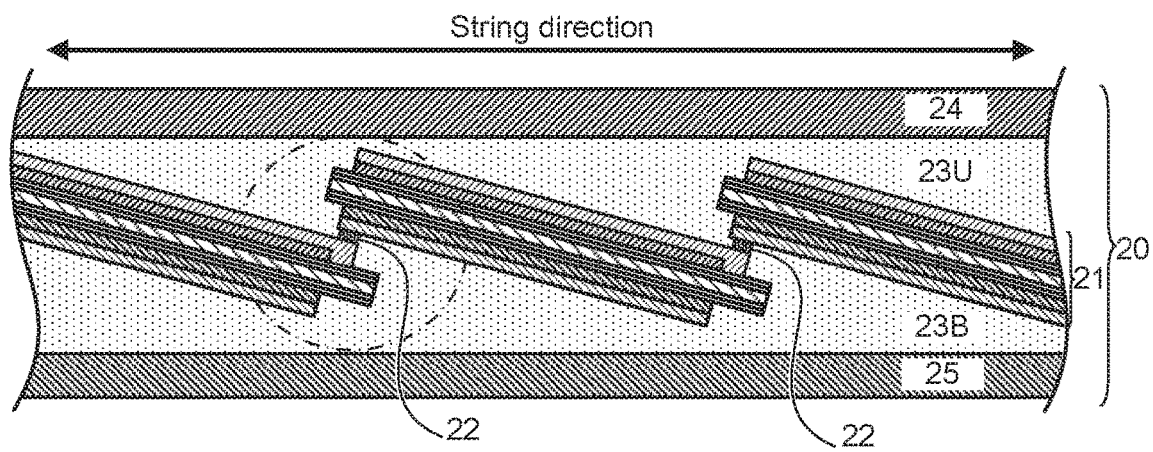
FIG. 6 is a sectional view of the solar cell according to some embodiments.

Referring FIG. 5 and FIG. 6 (which is a sectional view taken along line i-i' of FIG. 5), an exemplary solar cell module 20 includes at least one solar cell string 21, which in turn includes a plurality of the double-sided electrode type solar cells 10 electrically connected to each other. According to these embodiments, the solar cell module 20 includes the solar cell string 21 (which includes at least two solar cells 10), a conductive adhesive agent 22, a sealing material 23 (which includes a light receiving side sealing material 23U and a backside sealing material 23B), a light receiving side protective member 24, and a backside protective member 25.

In some embodiments, in the solar cell string 21, the plurality of solar cells 10 are electrically connected through the conductive adhesive agent 22.

In some embodiments, the plurality of solar cells 10 in the solar cell string 21 include a first solar cell and a second solar cell adjacent to the first solar cell. The first solar cell is below the second solar cell, and is located at the E2S side of the second solar cell. In the solar cell string 21, a part of the first solar cell 10 is on one surface side (for example, the light receiving surface 15SU side) at one end side E1S and overlaps a part of a second solar cell 10 on the other surface (for example, the back surface 15SB side) side at the other end side E2S. In some embodiments, the conductive adhesive agent 22 is interposed between the solar cells at the overlapping portion. In some embodiments, the conductive adhesive agent 22 is between the bus bar part BB which is a part of the first metal electrode layer 13p of the first solar cell and a part of the second metal electrode layer 13n of the second solar cell, and thus electrically connects the two solar cells 10.

Therefore, for example, in the solar cell string 21 formed of three solar cells 10, two sets of the "first solar cell" and the "second solar cell" are formed, and the solar cell 10 positioned in the center of three arranged solar cells 10 is the "second solar cell 10" in a case where the adjacent solar cell is the "first solar cell 10" on the other end side E2S (or one end side E1S), and is the "first solar cell 10" in a case where the adjacent solar cell is the "second solar cell 10" on one end side E1S (or the other end side E2S). That is, one solar cell 10 may be the "first solar cell", or may be the "second solar cell".

In addition, in a case where a part of the first solar cell 10 on one surface side at one end side E1S (for example, the light receiving surface 15SU side) overlaps a part of the second solar cell 10 on the other surface side at the other end side E2S (for example, the back surface 15SB side), a deposition structure is formed in which a plurality of solar cells 10 are inclined in a certain direction as with a tiled roof. From such an overview, a method in which the solar cells 10 are electrically connected as described above is referred to as a singling method.

In some embodiments, the conductive adhesive agent 22 include a conductive adhesive paste. In some embodiments, the conductive adhesive agent paste is a paste-like adhesive agent in which conductive particles are dispersed in a thermosetting adhesive resin material such as an epoxy resin, an acrylic resin, or a urethane resin. However, the present invention is not limited thereto. In some embodiments, a conductive adhesive film or an anisotropic conductive film that is formed into the shape of a film by dispersing conductive particles in a thermosetting adhesive resin material is used.

In some embodiments, the sealing material 23 seals and protects the solar cell 10, and is interposed between the surface of the solar cell 10 on the light receiving side and the light receiving side protective member 24, and between the surface of the solar cell 10 on the backside and the backside protective member 25. In the instant specification, the sealing material 23 covering the light receiving side of the solar cell 10 is sometimes referred to as the light receiving side sealing material 23U, and the sealing material 23 covering the backside of the solar cell 10 is sometimes referred to as the backside sealing material 23B.

The shapes of the light receiving side sealing material 23U and the backside sealing material 23B are not particularly limited. In some embodiments, the sealing materials 23U and 23B are in a sheet shape. When the sealing materials 23U and 23B are in the sheet shape, the surface and the back surface of the planar solar cell 10 are easily covered.

The material of the sealing material 23 is not particularly limited. In some embodiments, the material of the sealing material 23 is material allowing light to transmit (having light transmissive properties). In some embodiments, the material of the sealing material 23 has adhesive properties. When the sealing material 23 has adhesive properties, the sealing material 23 is able to adhere the solar cell 10, the light receiving side protective member 24, and the backside protective member 25 with one another.

Examples of such a material include a light transmissive resin such as an ethylene/vinyl acetate copolymer (EVA), an ethylene/α-olefin copolymer, ethylene/vinyl acetate/triallyl isocyanurate (EVAT), polyvinyl butyrate (PVB), an acrylic resin, a urethane resin, or a silicone resin. The material of the light receiving side sealing material 23U and the material of the backside sealing material 23B may be the same or different.

In some embodiments, the light receiving side protective member 24 covers the surface of the solar cell 10 on the light receiving surface through the light receiving side sealing material 23U and, as such, protects the solar cell 10. The shape of the light receiving side protective member 24 is not particularly limited. In some embodiments, the protective member 24 has a plate shape to indirectly cover the planar light receiving surface.

The material of the light receiving side protective member 24 is not particularly limited. In some embodiments, the material of the light receiving side protective member 24 is the same as or similar to the materials of the sealing material 23. In some embodiments, the material of the light receiving side protective member 24 is a material resistant to ultraviolet light while having light transmissive properties. In some embodiments, the material of the light receiving side protective member 24 includes glass, or a transparent resin such as an acrylic resin or a polycarbonate resin. In some embodiments, a surface of the light receiving side protective member 24 is processed into a depression-protrusion shape, or covered with an antireflection coating layer. When the surface of the light receiving side protective member 24 is processed into a depression-protrusion shape or covered with an antireflection coating layer, the light receiving side protective member 24 is less likely to reflect received light and thus guides more light to the solar cell 10.

In some embodiments, the backside protective member 25 covers the back surface of the solar cell 10 through the backside sealing material 23B, and protects the solar cell 10. The shape of the backside protective member 25 is not particularly limited. In some embodiments, the shape of the backside protective member 25 is a plate shape or a sheet shape that indirectly covers the planar back surface. In some embodiments, the shape of the backside protective member 25 is the same as or similar to the light receiving side protective member 24.

The material of the backside protective member 25 is not particularly limited. In some embodiments, the material of the back side protective member includes a material preventing the infiltration of water or the like (having high water barrier properties). In some embodiments, the backside protective member 25 include a laminated body of a resin film such as polyethylene terephthalate (PET), polyethylene (PE), an olefin-based resin, a fluorine-containing resin, or a silicone-containing resin, or a metal foil such as an aluminum foil.

The manufacturing method of the solar cell module 20 is not particularly limited. In some embodiments, the backside protective member 25, the backside sealing material 23B, the solar cell 10 (the solar cell string 21), the light receiving side sealing material 23U, and the light receiving side protective member 24 are stacked in this order, are heated and pressurized at a predetermined temperature and a predetermined pressure. In some embodiments, the above method is carried out with a laminator or the like performing evacuation.

Exemplary solar cell string 21 used in the solar cell module 20 as described above will be described in detail by using FIGS. 3 and 4, in addition to FIG. 1 that is an enlarged view of a circle portion with a dashed line of FIG. 6.

As illustrated in FIGS. 3 and 4, in some embodiments, the solar cell 10 of the solar cell string 21 includes layers the same as or similar to those as described in "Double-Sided Electrode Type Solar Cell" section, as well as regions A, B, C, and D as described in that section.

Referring to FIG. 6, in some embodiments, in the solar cell module 20, a portion of the first solar cell is shielded by the second solar cell on the light receiving surface 15SU side of the first solar cell. In some embodiments, the conductive adhesive agent 22 is interposed between the parts and electrically connects both of the solar cells. According to these embodiments, the region A is shielded by the second solar cell.

In the solar cell 10, pn junction exhibiting a photovoltaic effect occurs on the first major surface (15SU according to FIGS. 1, 3, 7 and 9) of the semiconductor substrate 15 on which the first conductivity type semiconductor layer 17$p$ is formed (in the case where an n-type semiconductor substrate is used—which is often the case). Therefore, passivation between the major surface 15SU and the first conductivity type semiconductor layer 17$p$ is important.

Referring to FIGS. 1, 3, 4 and 7-10, in some embodiments, an area of region A is larger than an area of region B. In some embodiments, in some embodiments, the length of the region B along a direction connecting one end side E1S to the other end side E2S is less than 2 times the thickness of the semiconductor substrate 15.

In a solar cell module having the singling method, such as the one illustrated in FIG. 1, a portion close to the first end side E1S of the first solar cell (the solar cell 10 on the lower left) is shielded by the a portion close to the second end side E2S of the second solar cell (the solar cell on the upper right). Due to this shielding, a dark current is sometimes generated. Furthermore, in the semiconductor substrate 15, the recombination of the carrier is more likely to occur in portions close to E1S and E2S ends. In addition, a dark current is also easily generated in these portions of the semiconductor substrate 15 comparing to a central portion, due to film formation around a side opposite to a film formation surface of the first conductivity type semiconductor layer 17$p$ or second conductivity type semiconductor layer 17$n$, a mechanical damage, or the like.

Referring to FIG. 1, the region A on the first solar cell not covered by the transparent oxide electrode layer for p-type 12$p$ however, could suppress the dark current. The reason is that, when the dark current is generated in the pn junction near the region A, there is no transparent oxide electrode layer in this region to collect the dark current. As a result, a decrease in the operating point voltage of the solar cell module 20 due to the dark current is less likely to occur, and the output of the solar cell module 20 does not decrease.

In addition, because most of the collection of the carriers generated in the semiconductor substrate 15 is performed by the transparent oxide electrode for p-type 12$p$, and thus, it is preferable that the area of the first transparent oxide electrode layer 12$p$ is large, as long as the void area left for the region A is sufficiently large. For this reason, in the solar cell 10, in some embodiments, the length of the region B along a direction connecting one end side E1S to the other end side E2S is less than 2 times the thickness of the semiconductor substrate 15. When the length of the region B along the direction is less than 2 times the thickness of the semiconductor substrate 15, both a large area of the first transparent oxide electrode layer 12$p$ and a sufficiently large area of region A can be achieved. This allows both improved output and suppressed dark current.

Refer to FIGS. 1, 3, 7 and 9, in some embodiments, an area of the region D is smaller than or equal to the area of the region B.

When the area of the region D is smaller than or equal to the area of the region B, at the E2S end, a potential difference between the transparent oxide electrode layer for n-type 12$n$ and the semiconductor substrate 15 is smaller than or equal to a potential difference between the transparent oxide electrode layer for p-type 12$p$ and the semiconductor substrate 15. Accordingly, in a case where a dark current is generated, the current is less likely to flow through the transparent oxide electrode layer for n-type 12$n$. Therefore, in some embodiments, the region D is narrow (that is, the transparent oxide electrode layer for n-type 12$n$ is wide). Because it is sufficient that the area of the region D is smaller than or equal to the area of the region B, in some embodiments, the region D does exist.

Refer to FIGS. 1, 3, 7 and 9, in some embodiments, an area of the region C is larger than the area of the region B.

In the solar cell module 20 having a configuration according to the singling method, in a case where the region A is disposed in the end portion of the semiconductor substrate 15 that is the light shielding region due to the overlap of the solar cell 10, the conductive adhesive agent 22 is disposed in the region A or in the vicinity thereof by coating or the like. For this reason, in the connection of the solar cells 10, the conductive adhesive agent 22 sometimes spread not only to the region A, but also wrap around E1 edge of solar cell 10 and reaches the region C.

When the area of the region C is larger than the area of the region B, the region C is wide. As such even if the conductive adhesive agent 22 extends to the region C during the production process, the conductive adhesive agent 22 is less likely to make contact with the transparent oxide electrode layer for n-type 12$n$. Therefore, a leakage due to the conductive adhesive agent 22 bridging the transparent oxide electrode layer for p-type 12$p$ and the transparent oxide electrode layer for n-type 12$n$ is less likely to occur.

Note that, the above description regarding the region A to the region D are made referring to the case in which the first major surface of the substrate 15 is the light receiving surface 15SU. In the above case, the p-type semiconductor layer/electrode layers are on the light receiving side. One of ordinary skill in the art would understand that similar principles also applies to the case in which the second major surface of the substrate 15 is the light receiving surface and the n-type semiconductor layer/electrode layers are on the light receiving side, which is described below.

Referring to FIG. 2, the region C of the first solar cell is shielded by the second solar cell.

In some embodiments, in the solar cell module exemplified in FIG. 2, in each solar cell, the area of the region A is larger than the area of the region B. According to these embodiments, in the solar cell module 20, when a dark current is generated in the pn junction of the region A near the first edge E1S on the first surface (back surface 15SB) side, there is no transparent oxide electrode layer for p-type, and thus, the dark current is not collected. As a result thereof, a decrease in the operating point voltage of the solar cell module 20 due to the dark current is less likely to occur, and the output of the solar cell module 20 does not decrease.

Referring to FIG. 2, in some embodiments, a length of the region B along the direction connecting one end side E1S to the other end side E2S (the string direction) is less than 2 times the thickness of the semiconductor substrate 15. According to the solar cell 10 of FIG. 2, the p-type semiconductor layer 17$p$ is disposed on the back surface 15SB side. Even the pn junction surface is not facing the light receiving side, most of the collection of the carriers generated in the semiconductor substrate 15 is performed by the transparent oxide electrode layer for p-type 12$p$. As such, the area of the transparent oxide electrode layer for p-type 12$p$ is large, as long as there is sufficient area for the region A.

Referring to FIG. 2, in some embodiments, the area of the region D is smaller than or equal to the area of the region B. When the area of the region D is smaller than or equal to the area of the region B, a potential difference between the transparent oxide electrode layer for n-type 12$n$ and the semiconductor substrate 15 is less than a potential difference between the transparent oxide electrode layer for p-type 12p and the semiconductor substrate 15, and thus, a dark current is less likely to flow through the transparent oxide electrode layer for n-type 12n. Therefore, in some embodiments, the region D is narrow.

Note that, it is sufficient that the area of the region D is smaller than or equal to the area of the region B. Therefore, in some embodiments, region D does exist and the entirety of E2S on the light receiving surface 15SU is covered by the transparent oxide electrode layer for n-type 12n.

Refer to FIG. 2, in some embodiments, the area of the region C is larger than the area of the region B.

In the solar cell module 20 adopting the singling method, in a case where the region C is disposed in the end portion of the semiconductor substrate 15 which is shielded by the overlapping portion of the second solar cell 10, the conductive adhesive agent 22 is disposed in the region C or in the vicinity thereof. For this reason, in the connection of the solar cells 10, the conductive adhesive agent 22 sometimes not only spread to the region C, but also wrap around the region A positioned on a side opposite to the region C, over the end portion of the semiconductor substrate 15. When the region C of is sufficiently wide, adhesive agent 22 is unlikely to wrap around the edge and advance to the p-type semiconductor layer 17p. Accordingly, a leakage due to the conductive adhesive agent 22 that bridges a gap between one end side E1S of the transparent oxide electrode layer for p-type 12p and one end side E1S of the transparent oxide electrode layer for n-type 12n is less likely to occur.

Referring to FIG. 1, when the first surface of the semiconductor substrate 15 is the light receiving surface 15SU, the solar cell module 20 is formed of the solar cell 10 in which the p-type semiconductor layer 17p is disposed on the light receiving surface 15SU, and the n-type semiconductor layer 17n is disposed on the back surface 15SB. Accordingly, in some embodiments, in the solar cell 10, at least a portion of the region A is covered by the metal electrode layer for p-type 13p that is electrically connected to the transparent oxide electrode layer for p-type 12p. When the region A is fully or partially covered by the metal electrode layer for p-type 13p, the leakage between the p-type semiconductor layer 17p and the n-type semiconductor layer 17n is reduced or eliminated. Furthermore, since a part of the metal electrode layer for p-type 13p extends to the region A, in some embodiments, the conductive adhesive agent 22 is disposed in region A. When the region A is covered by the second solar cell 10, the conductive adhesive agent 22 is shielded by the second solar cell 10. As a result thereof, in the solar cell module 20, the conductive adhesive agent 22 does not protrude to the light receiving surface 15SU side over a shielding region, and thus, a shadow loss due to the conductive adhesive agent 22 is suppressed.

When the region A is shielded by the second solar cell 10, a portion of the metal electrode layer for p-type 13p that extends to the region A is also shielded by the second solar cell 10.

In some embodiments, an area of the metal electrode layer for n-type 13n that is electrically connected to the transparent oxide electrode layer for n-type 12n by covering the transparent oxide electrode layer for n-type 12n is smaller than or equal to the area of the transparent oxide electrode layer for n-type 12n, and does not overlap the region C.

Referring to FIGS. 7 and 8, in some embodiments, the metal electrode layer for p-type 13p includes only the finger part FG. As will be described in the "Solar Cell Module" section below, in some embodiments, the conductive adhesive agent 22 connecting adjacent solar modules is disposed in the position of the bus bar part BB illustrated in FIG. 3 to carry out the function of the bus bar part BB.

Referring to FIGS. 9 and 10, in some embodiments, the finger part FG fall within the surface of the transparent oxide electrode layer for p-type 12p. According to these embodiments, the conductive adhesive agent 22 is disposed to connect the respective finger parts FG, and used instead of the bus bar part BB illustrated in FIG. 3. In some embodiments, the conductive adhesive agent 22 is disposed on the transparent oxide electrode layer for p-type 12p, and is disposed on the p-type conductivity type semiconductor layer 17p.

In some embodiments, the bus bar part BB or the conductive adhesive agent 22 are in the shape of a plurality of lines, or in a non-linear shape.

Note that, the present invention is not limited to the embodiment described above, and various changes can be made within the scope of the claims. That is, embodiments obtained by combining technical means that are suitably changed within the scope of the claims are also included in the technical scope of the present invention.

EXAMPLES

Hereinafter, the present invention will be described in detail by Examples; however, the present invention is not limited to these Examples.

First, in a plane orientation (100) of an incident surface, a 6-inch n-type monocrystalline silicon substrate having a thickness of 200 µm was washed with acetone, and then, was immersed in an aqueous solution of HF of 2 weight % for 5 minutes, a silicon oxide layer on the surface was removed, and rinsing with ultrapure water was performed twice. After that, the semiconductor substrate was immersed in an aqueous solution of KOH/isopropyl alcohol of 5/15 weight % that was retained at 75° C. for 15 minutes. Next, the semiconductor substrate was immersed in an aqueous solution of HF of 2 weight % for 5 minutes, was rinsed with ultrapure water twice, and was dried at a normal temperature.

Note that, the surface of the dried semiconductor substrate was observed with an atomic force microscope (AFM), and as a result thereof, a texture structure in the shape of a quadrangular pyramid was formed on both surfaces, and arithmetic average roughness thereof was 2100 nm.

The surface of the monocrystalline silicon substrate in which the texture has been formed was immersed in an aqueous solution of HCl of 5% at 70° C. for 5 minutes, and an alkaline component remaining on the surface was neutralized. After that, the surface was washed for 10 minutes by using ozone water of 15 ppm, and was immersed in an aqueous solution of HF of 5% for 2 minutes, and thus, an ozone oxide film was removed.

In Examples 1 and 2 and Comparative Example 1 described below, the semiconductor substrate described above was used. Specifically, a p-type semiconductor layer and an n-type semiconductor layer were formed on the semiconductor substrate, a transparent oxide electrode layer and a metal electrode layer were formed thereon, and the semiconductor substrate was divided at a desired position, by using laser. For this reason, an electrode layer was formed in accordance with a plurality of divided pieces formed from a large-sized semiconductor substrate. In addition, the divided pieces (solar cells) were connected by using a conductive adhesive agent, in a singling method, and thus, a solar cell string was obtained. Then, a solar cell module was prepared by using the solar cell string. Hereinafter, the details will be described.

Example 1

First, a large-sized semiconductor substrate was introduced into a CVD device, an i-layer amorphous silicon layer of 4 nm was formed on one surface, as an intrinsic semiconductor layer, and a p-type amorphous silicon layer of 5 nm was formed thereon, as the p-type semiconductor layer.

As a film formation condition of the intrinsic semiconductor layer, a substrate temperature was 180° C., a pressure was 130 Pa, a flow ratio of $SiH_4/H_2$ was 2/10, and an input power density was 0.03 $W/cm^2$.

As a film formation condition of the p-type semiconductor layer, a substrate temperature was 190° C., a pressure was 130 Pa, a flow ratio of $SiH_4/H_2/B_2H_6$ was 1/10/3, and an input power density was 0.04 $W/cm^2$. Note that, gas in which the concentration of $B_2H_6$ was diluted by $H_2$ to 5000 ppm was used as $B_2H_6$ gas described above.

Next, an i-layer amorphous silicon layer of 5 nm was formed on the other surface of the semiconductor substrate, as the intrinsic semiconductor layer, and an n-type amorphous silicon layer of 10 nm was formed thereon, as the n-type semiconductor layer. The film formation condition of the intrinsic semiconductor layer is as described above. As a film formation condition of the n-type semiconductor layer, a substrate temperature was 180° C., a pressure was 60 Pa, a flow ratio of $SiH_4/PH_3$ was 1/2, and an input power density was 0.02 $W/cm^2$. Note that, gas in which the concentration of $PH_3$ was diluted by $H_2$ to 5000 ppm was used as $PH_3$ gas described above.

Subsequently, the semiconductor substrate including the conductivity type semiconductor layer was sent to a sputtering chamber, an ITO layer of 120 nm was formed on the p-type semiconductor layer and the n-type semiconductor layer, as a transparent electrode layer. Note that, a region A to a region D were formed by a lift-off method using a film mask.

Specifically, in one solar cell, for example, on one end that is a side covered with another solar cell, the length of the regions A and C along a string direction connecting one end side to the other end side, from the end of the solar cell on one end side, was set to 1100 μm. On the other hand, in one solar cell, for example, on the other end that is a side covering another solar cell, the length of the regions B and D along a string direction connecting the other end side to one end side, from the end of the solar cell on the other end side, was set to 150 μm.

Note that, a flexible resin film formed of polypropylene was used as the film mask. In addition, a biaxially stretched film was used as the film mask, from the viewpoint of a strength, heat resistance, dimensional stability, or the like.

Subsequently, the semiconductor substrate including the transparent oxide electrode layer was sent to a printing chamber, and was coated with a silver paste by screen printing, and thus, a metal electrode layer was formed. Specifically, comb-tooth type metal electrode layers were formed on the transparent electrode layers on a light reception side and a backside. Note that, the metal electrode layer on the light reception side was approximately orthogonal to a finger part and a bus bar electrode. Note that, the width of the finger part of the light reception side was approximately 50 μm, an interval (a pitch) therebetween was approximately 1800 μm, the width of the finger part on the backside was approximately 50 μm, and an interval therebetween was approximately 500 μm.

Next, the semiconductor substrate including the electrode layer described above was sent to a laser chamber, and was cut by using a laser device, and thus, a solar cell having an approximately oblong shape was prepared. Note that, laser was incident from a formation surface side of the n-type semiconductor layer. In addition, the position of the laser was adjusted to a division position that was set at the time of forming the transparent oxide electrode layer.

Subsequently, the solar cell was sent to a dispenser chamber, the conductive adhesive agent was applied to the bus bar part in a region of a first solar cell to be superimposed, by using a dispenser, a second solar cell was overlapped with the first solar cell, and the first solar cell and the second solar cell were joined by thermal compression bonding. Such junction using the overlap was repeated by using a total of 34 solar cells. As a result thereof, a solar cell string was prepared in which 34 solar cells were electrically connected in series. Note that, as a thermal compression bonding condition, a temperature was 150° C., a time was 20 minutes, and a pressure was 5 MPa.

Subsequently, the solar cell string was sent to a sealing chamber, a light reception side sealing material, the solar cell string, a backside sealing material, and a backside protective member were laminated in this order, on a light reception side protective material, and the solar cell string was sealed, and thus, a solar cell module was prepared. Note that, 10 solar cell strings were arranged in 5 parallels×2 series (a total of 340 solar cells), and thus, an assembly of the solar cell strings was obtained. In addition, modularization was performed such that the p-type semiconductor layer of each of the solar cells was directed towards the light reception side.

Example 2

The p-type semiconductor layer was disposed on the light receiving surface side, and the n-type semiconductor layer was disposed on the back surface side in the solar cell module of Example 1 while in Example 2, the direction was reversed, that is, the n-type semiconductor layer was disposed on the light receiving surface side, and the p-type semiconductor layer was disposed on the back surface side. In addition, the length of the region A was 1100 μm, and the length of the region B was 150 μm, but the region C and the region D were not formed, that is, the transparent oxide electrode layer was formed on the entire surface of the n-type semiconductor layer on the light receiving surface side.

Comparative Example 1

In Comparative Example 1, in the solar cell module of Example 1, only the transparent oxide electrode layer was changed. Specifically, the transparent oxide electrode layer was formed on the entire surface of the conductivity type semiconductor layer of the solar cell without using the film mask.

Evaluation

Reference sunlight having an air mass (AM) of 1.5 was emitted at a light amount of 100 $mW/cm^2$, by a solar simulator, and in the solar cell modules of Examples 1 and 2 and Comparative Example 1, solar cell properties (an open voltage (Voc), a short-circuit current density (Isc), a fill factor (FF)), and output (W) were measured (refer to Table 1).

TABLE 1

|  | Open voltage (Voc) [V] | Short-circuit current density (Isc) [A] | Fill factor (FF) [%] | Output (Power) [W] |
|---|---|---|---|---|
| Example 1 | 50.116 | 9.205 | 77.02 | 355.300 |
| Example 2 | 50.022 | 9.022 | 76.87 | 346.913 |
| Comparative Example 1 | 49.640 | 9.225 | 73.71 | 337.535 |

From Table 1, it was determined that the output was higher in Example 1 and Example 2 than in Comparative Example 1. It is considered that this is because in both of the examples, a dark current of a shield portion of the solar cell due to the singling method was reduced, and thus, a diode loss in the solar cell was reduced, and thus, the fill factor (FF) was improved.

In addition, in Comparative Example 1, it is considered that the transparent oxide electrode layer is formed on the entire surface of the conductivity type semiconductor layer, and thus, it is considered that a leakage occurs due to the reattachment of a residue, and fusion droop of the transparent oxide electrode layer, at the time of being divided by laser irradiation. On the other hand, in both of the examples, a division portion of the laser irradiation is a region in which the transparent oxide electrode layer is not formed. For this reason, a leakage does not occur as with Comparative Example 1, and thus, it is considered that output properties are improved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

EXPLANATION OF REFERENCE NUMERALS

10 SOLAR CELL [DOUBLE-SIDED ELECTRODE TYPE SOLAR CELL]
11 ELECTRODE LAYER
12 TRANSPARENT OXIDE ELECTRODE LAYER
12p TRANSPARENT OXIDE ELECTRODE LAYER for p-TYPE
12n TRANSPARENT OXIDE ELECTRODE LAYER for n-TYPE
13 METAL ELECTRODE LAYER
13p METAL ELECTRODE LAYER for p-TYPE
13n METAL ELECTRODE LAYER for n-TYPE
15 SEMICONDUCTOR SUBSTRATE
15S MAJOR SURFACE OF SEMICONDUCTOR SUBSTRATE
15SU MAJOR SURFACE OF SEMICONDUCTOR SUBSTRATE ON THE LIGHT RECEIVING SIDE
15SB MAJOR SURFACE OF SEMICONDUCTOR SUBSTRATE ON THE BACKSIDE
16 INTRINSIC SEMICONDUCTOR LAYER
17 SEMICONDUCTOR LAYER
17p p-TYPE SEMICONDUCTOR LAYER/p-TYPE CONDUCTIVITY TYPE SEMICONDUCTOR
17n n-TYPE SEMICONDUCTOR LAYER/n-TYPE CONDUCTIVITY TYPE SEMICONDUCTOR
20 SOLAR CELL MODULE
21 SOLAR CELL STRING
22 CONDUCTIVE ADHESIVE AGENT
23 SEALING MATERIAL
23U LIGHT RECEPTION SIDE SEALING MATERIAL
23B BACKSIDE SEALING MATERIAL
24 LIGHT RECEPTION SIDE PROTECTIVE MEMBER
25 BACKSIDE PROTECTIVE MEMBER
E1S ONE END SIDE/FIRST EDGE
E2S OTHER END SIDE/SECOND EDGE
A REGION A
B REGION B
C REGION C
D REGION D

What is claimed is:

1. A double-sided electrode type solar cell, comprising:
a semiconductor substrate;
a p-type semiconductor layer on a first surface of the semiconductor substrate;
a transparent oxide electrode layer for p-type on the first surface of the semiconductor substrate and the p-type semiconductor layer;
an n-type semiconductor layer on a second surface of the of the semiconductor substrate; and
a transparent oxide electrode layer for n-type on the second surface of the semiconductor substrate and the n-type semiconductor layer,
wherein
on the first surface and at a first edge of the semiconductor substrate, a region of the p-type semiconductor layer not covered by the transparent oxide electrode layer for p-type is defined as a "region A",
on the first surface and at a second edge opposite to the first edge of the semiconductor substrate, a region of the p-type semiconductor layer not covered by the transparent oxide electrode layer for p-type is defined as a "region B", and
an area of the region A is larger than an area of the region B.

2. The double-sided electrode type solar cell according to claim 1, wherein a length of the region B along a direction connecting the first edge and the second edge is less than 2 times a thickness of the semiconductor substrate.

3. The double-sided electrode type solar cell according to claim 1, wherein
on the second surface and at the second edge of the semiconductor substrate, a region of the n-type semiconductor layer that is not covered by the transparent oxide electrode layer for n-type is defined as a "region D", and
an area of the region D is smaller than or equal to the area of the region B.

4. The double-sided electrode type solar cell according to claim 1, wherein
on the second surface and at the first edge of the semiconductor substrate, a region of the n-type semiconductor layer that is not covered by the transparent oxide electrode layer for n-type is defined as a "region C", and
an area of the region C is larger than the area of the region B.

5. The double-sided electrode type solar cell according to claim 1, further comprises a metal electrode layer for n-type on and electrically connected to the transparent oxide electrode layer for n-type, wherein
- a light receiving side of the double-sided electrode type solar cell faces the first surface of the semiconductor substrate, and
- the metal electrode layer for p-type at least partially covers region A.

6. The double-sided electrode type solar cell according to claim 5, further comprises a metal electrode layer for n-type on the transparent oxide electrode layer for n-type and electrically connected to the transparent oxide electrode layer for n-type, wherein
- on the second surface and at the first edge of the semiconductor substrate, a region of the n-type semiconductor layer that is not covered by the transparent oxide electrode layer for n-type is defined as a "region C", and
- an area where the metal electrode layer for n-type covers the transparent oxide electrode layer for n-type is smaller than or equal to an area of the transparent oxide electrode for n-type, and does not overlap with the region C.

7. The double-sided electrode type solar cell according to claim 1, further comprises a metal electrode layer for n-type on and electrically connected to the transparent oxide electrode layer for n-type, wherein
- on the second surface and at the first edge of the semiconductor substrate, a region of the n-type semiconductor layer that is not covered by the transparent oxide electrode layer for n-type is defined as a "region C", and
- a light receiving side of the double-sided electrode type solar cell faces the second surface of the semiconductor substrate, and
- the metal electrode layer for n-type at least partially covers region C.

8. The double-sided electrode type solar cell according to claim 7, further comprises a metal electrode layer for n-type on the transparent oxide electrode layer for n-type and electrically connected to the transparent oxide electrode layer for n-type, wherein an area where the metal electrode layer covers the transparent oxide electrode layer for n-type is smaller than or equal to an area of the transparent oxide electrode for n-type, and does not overlap with the region C.

9. A solar cell module, comprising at least one cell string, wherein each solar cell string of the at least one cell string comprises:
- at least two double-sided electrode type solar cells according to claim 1, wherein a first double-sided electrode type solar cell of the at least two double-sided electrode type solar cells is electrically connected to a second double-sided electrode type solar cell adjacent to the first double-sided electrode type solar cell by a conductive adhesive, wherein
- a first side of the first double-sided electrode type solar cell overlaps with a second side of the second double-sided electrode type solar cell, and
- the conductive adhesive is electrically connected to the first side of the first double-sided electrode type solar cell and the second side of the second double-sided electrode type solar cell.

10. The solar cell module according to claim 9, wherein
- in the at least two double-sided electrode type solar cells, a light receiving side faces the first surface of the semiconductor substrate, and region A of the first double-sided electrode type solar cell is shielded by the second double-sided electrode type solar cell, or
- in the at least two double-sided electrode type solar cells, on the second surface and at the first edge of the semiconductor substrate, a region of the n-type semiconductor layer that is not covered by the transparent oxide electrode layer for n-type is defined as a "region C", a light receiving side faces the second surface of the semiconductor substrate, and region C of the first double-sided electrode type solar cell is shielded by the second double-sided electrode type solar cell is shielded.

* * * * *